(12) United States Patent
Fujie

(10) Patent No.: US 9,887,187 B2
(45) Date of Patent: *Feb. 6, 2018

(54) SEMICONDUCTOR DEVICE FOR PREVENTING FIELD INVERSION

(71) Applicant: ROHM CO., LTD., Kyoto (JP)

(72) Inventor: Shusaku Fujie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,641

(22) Filed: Mar. 25, 2016

(65) Prior Publication Data

US 2016/0211252 A1    Jul. 21, 2016

Related U.S. Application Data

(63) Continuation of application No. 14/314,726, filed on Jun. 25, 2014, now Pat. No. 9,306,002.

(30) Foreign Application Priority Data

Jun. 26, 2013 (JP) ................................. 2013-134001

(51) Int. Cl.
   *H01L 29/06* (2006.01)
   *H01L 29/66* (2006.01)
   (Continued)

(52) U.S. Cl.
   CPC ........ *H01L 27/0251* (2013.01); *H01L 21/761* (2013.01); *H01L 23/4824* (2013.01); *H01L 27/0883* (2013.01); *H01L 29/0646* (2013.01); *H01L 29/0649* (2013.01); *H01L 29/7816* (2013.01); *H01L 29/7817* (2013.01); *H01L 29/7823* (2013.01); *H01L 29/0653* (2013.01); *H01L 29/0878* (2013.01); *H01L 29/42368* (2013.01); *H01L 2924/0002* (2013.01)

(58) Field of Classification Search
   CPC ........................... H01L 21/76; H01L 29/0642
   See application file for complete search history.

(56) References Cited

U.S. PATENT DOCUMENTS 4,862,242 A    8/1989  Wildi et al.
6,133,107 A *  10/2000 Menegoli ............ H01L 27/0727
                                                257/E27.033

(Continued)

FOREIGN PATENT DOCUMENTS

JP      09-213895 A    8/1997
JP      2001-250921 A  9/2001

(Continued)

*Primary Examiner* — Daniel Whalen
(74) *Attorney, Agent, or Firm* — Rabin & Berdo, P.C.

(57) ABSTRACT

A semiconductor device includes a semiconductor layer having an element formation region in which a semiconductor element is formed. An element isolation well is formed in a surface portion of the semiconductor layer to isolate the element formation region. A field insulating film is formed on a surface of the semiconductor layer. The field insulating film surrounds the element formation region in an annular shape when viewed from a top. An interlayer insulating film is formed on the semiconductor layer. A wiring is formed on the interlayer insulating film. A conductive film is formed on the field insulating film.

12 Claims, 10 Drawing Sheets

(51) Int. Cl.
    *H01L 27/02*     (2006.01)
    *H01L 29/78*     (2006.01)
    *H01L 23/482*     (2006.01)
    *H01L 21/761*     (2006.01)
    *H01L 27/088*     (2006.01)
    *H01L 29/423*     (2006.01)
    *H01L 29/08*     (2006.01)

(56) References Cited

U.S. PATENT DOCUMENTS

| | | | |
|---|---|---|---|
| 9,306,002 B2* | 4/2016 | Fujie | H01L 29/0646 |
| 2001/0019166 A1 | 9/2001 | Tsuyuki | |
| 2006/0220099 A1* | 10/2006 | Kikuchi | H01L 29/402 |
| | | | 257/315 |
| 2010/0001343 A1 | 1/2010 | Choi et al. | |
| 2013/0344671 A1 | 12/2013 | Kim | |
| 2014/0061787 A1 | 3/2014 | Kim | |

FOREIGN PATENT DOCUMENTS

| | | |
|---|---|---|
| JP | 2006-310719 A | 11/2006 |
| JP | 2007-109873 A | 4/2007 |
| JP | 2012-156205 A | 8/2012 |

\* cited by examiner

SEMICONDUCTOR DEVICE FOR PREVENTING FIELD INVERSION

CROSS-REFERENCE TO RELATED APPLICATIONS

This is a continuation application of U.S. application Ser. No. 14/314,726, filed on Jun. 25, 2014, and allowed on Dec. 2, 2015. These applications are based upon and claim the benefit of priority from Japanese Patent Application No. 2013-134001, filed on Jun. 26, 2013, the entire contents of which are incorporated herein by reference.

TECHNICAL FIELD

The present disclosure relates to a semiconductor device.

BACKGROUND

A conventional semiconductor device may include a p-type well region that isolates an element forming region, and a DMOS transistor that is formed in the element forming region. The semiconductor device may also include a p-type silicon substrate, n-type source and drain regions that are selectively formed on the silicon substrate and isolated from each other by a field oxide film, and a gate electrode that is formed on the silicon substrate with a gate oxide film interposed between the gate electrode and the silicon substrate. The field oxide film may be formed in the p-type well region.

In the semiconductor device having a conventional element isolation structure as described above, the DMOS transistor may be mounted together with other elements. Such a semiconductor device may include not only a wiring electrically connected to the DMOS transistor but also additional wirings electrically connected to different elements. Thus, different voltages, which are adapted for the different elements, respectively, may be applied to the additional wirings.

In this case, if the wirings pass near a field insulating film or intersect the field insulating film, an electric field from the wirings attracts anions in the semiconductor substrate to a region directly below the field insulating film (i.e., a surface of the p-type well region which separates the element forming region), causing a field inversion in the p-type well region. Thus, a region where the field inversion is caused may act as a leak path through which a leakage current may flow, which may result in an element isolation failure. Such a leakage current caused by the electric field from the wirings becomes more considerable when a voltage applied to the wirings increases.

To avoid the above problem, a device may be designed based on a design rule for forming wirings to be spaced apart from a field insulating film by a specified distance depending on the amount of voltages applied to the wirings. However, using this method, some areas of a semiconductor chip may not effectively be used and it may be difficult to further reduce the size of the semiconductor chip.

SUMMARY

The present disclosure provides some embodiments of a semiconductor device to prevent a field inversion, thereby achieving the more stable element isolation.

The present disclosure provides some embodiments of a semiconductor device which can effectively utilize a semiconductor chip area and further reduce the size of the semiconductor chip.

According to one embodiment of the present disclosure, there is provided a semiconductor device including a semiconductor layer of a first conductivity type; an element isolation well of a second conductivity type, which is formed on a surface of the semiconductor layer and isolates an element formation region; a field insulating film configured to cover a surface of the element isolation well; an interlayer insulating film formed on the semiconductor layer; a wiring formed on the interlayer insulating film; and a conductive film formed on the wiring and the field insulating film, a voltage potential of the conductive film being fixed to be a specified voltage potential.

With this configuration, an effect by an electric field from the wiring can be reduced by the conductive film. Specifically, since the conductive film fixed at the specified voltage potential is disposed at a position closer to the wiring than the element isolation well, the electric field from the wiring can be effectively terminated by the conductive film. Thus, it is possible to prevent a field inversion which may be caused when ions in the element isolation well are attracted to the region directly below the field insulating film by the electric field. As a result, it is possible to prevent a leakage current which may flow through a leak path formed across the element isolation well, thereby providing a semiconductor device with the more stable element isolation.

Therefore, since the wiring can be close to or intersect the field insulating film, a wiring design rule can be alleviated, thereby increasing a degree of freedom in designing to form wirings. As a result, the semiconductor chip area can be effectively utilized to further reduce the size of the semiconductor chip.

In one embodiment, the element formation region may include a low voltage element region in which an element operated with a low reference voltage is formed and a high voltage element region in which an element operated with a high reference voltage is formed. The high reference voltage may be higher than the low reference voltage, the low and high voltage element regions may be isolated by the element isolation well, and the wiring may be electrically connected to the element formed in the high voltage element region.

If the wiring is connected to the high voltage element region, the magnitude of an electric field by the wiring is relatively large as compared to when the wiring is connected to the low voltage element region, and thus, it is more likely to produce a field inversion in the element isolation well. Therefore, with this configuration, even under conditions where the wiring (i.e., high voltage wiring) passing near the field insulating film on the element isolation well or intersecting the field insulating film is connected to the high voltage element region, which may result in higher possibility of field inversion, the electric field by the high voltage wirings can be effectively terminated by the conductive film.

In one embodiment, the wiring may intersect the element isolation well when viewed from the top, and the conductive film may be interposed between the field insulating film and an intersection portion of the wiring.

If the wiring intersects the element isolation region, since a distance between the wiring and the element isolation is short as compared to a case where the wiring does not intersect the element isolation region, the element isolation well is more likely to be affected by the electric field by the wirings, which may result in a higher possibility of a field inversion. Therefore, with this configuration, even under conditions where the wiring intersects the element isolation region, which may result in a higher possibility of a field inversion, the electric field by the wiring can be effectively terminated by the conductive film. In addition, by intersecting the wiring with the element isolation well, it is possible to utilize a semiconductor chip area with higher efficiency.

In an embodiment, a length of the conductive film may be equal to or larger than a length of the intersection portion in a direction in which the element isolation well intersects the wiring at the intersection portion.

With this configuration, in forming the wirings, it is possible to reliably intersect the conductive film with the wiring even when a positional difference (e.g., misalignment) of the wiring occurs in the extension direction of the element isolation well. Therefore, it is possible to effectively prevent a field inversion from being produced in the element isolation well immediately below the field insulating film in the intersection.

In one embodiment, a length of the conductive film may be smaller than a length of the intersection portion in a direction in which the wiring intersects the element isolation well at the intersection portion.

In another embodiment, a length of the conductive film is equal to or larger than a length of the intersection portion in a direction in which the wiring intersects the element isolation well at the intersection portion.

With those configurations, the element isolation region can entirely be covered by the conductive film through the field insulating film in the extension direction of the wiring. Thus, it is possible to effectively prevent a field inversion in the element isolation well immediately below the field insulating film.

In one embodiment, the element isolation well may be formed in a band shape, and the conductive film may be formed in a band shape along the element isolation well.

In another embodiment, the element isolation well may be formed in a band shape that forms a closed curve when viewed from the top, and the conductive film may be formed in a band shape that forms a closed curve along the element isolation well.

With those configurations, the conductive film is necessarily disposed directly above the element isolation well in the region on the field insulating film. Therefore, regardless of whether the wiring intersects or is close to the element isolation well, the electric field by the wirings can be properly terminated by the conductive film. As a result, without depending on a wiring rule, it is possible to prevent a field inversion in the element isolation well, which can result in a higher degree of freedom when applying the design rule for forming the wirings.

In one embodiment, the semiconductor device may include a MOS transistor formed in the element formation region, and the conductive film may include the same material as a gate of the MOS transistor and formed in the same layer as the gate.

With this configuration, the conductive film can be formed in the same process as the process of forming the gate of the MOS transistor. That is, the conductive film and the gate of the MOS transistor can be simultaneously formed by changing the layout of a resist mask in the method of manufacturing the semiconductor device. Therefore, there is no need to add a new manufacturing process, which can result in a decrease in number of manufacturing processes.

In one embodiment, the gate and the conductive film may include polysilicon.

In another embodiment, the interlayer insulating film may include a wiring layer, and the conductive film may be formed by a wiring film disposed in the wiring layer.

With those configurations, the conductive film can be formed in the same process as the process of forming the wiring layer. That is, the wiring layer and the conductive film can be simultaneously formed only by changing the layout of a resist mask in the method of manufacturing the semiconductor device. Therefore, there is no need to add a new manufacturing process, which can result in a decrease in number of manufacturing processes.

DETAILED DESCRIPTION

Examples according to various embodiments of the present disclosure are described below in detail with reference to the accompanying drawings.

Figure 1:
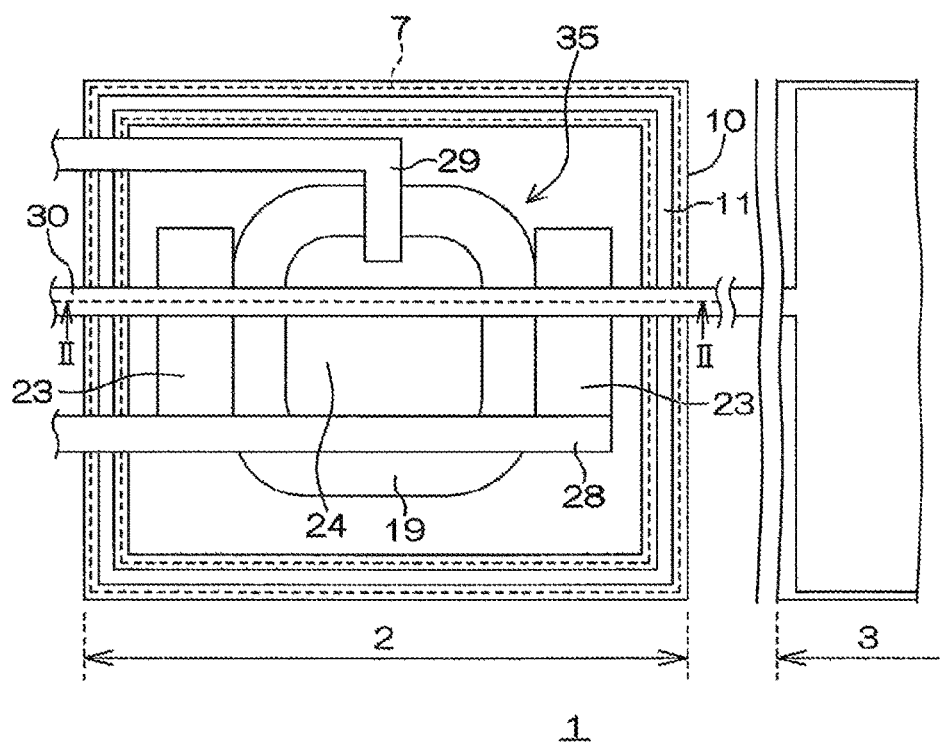
FIG. 1 schematically illustrates a plan view of a semiconductor device according to a first embodiment of the present disclosure.
Figure 2:
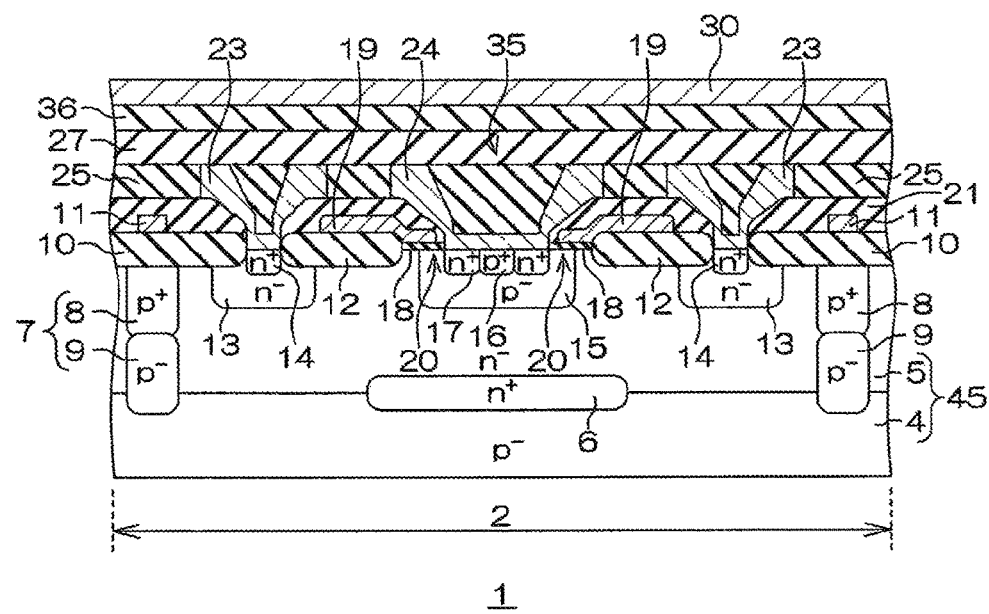
FIG. 2 illustrates a sectional view taken along line II-II in FIG. 1.

FIG. 1 schematically illustrates a plan view of a semiconductor device 1 according to a first embodiment of the present disclosure. FIG. 2 illustrates a sectional view taken along line II-II in FIG. 1.

The semiconductor device 1 includes an epitaxial substrate 45 as an example of a semiconductor layer in the present disclosure. The semiconductor device 1 also includes an element isolation well 7 in a surface portion of the epitaxial substrate 45. The element isolation well 7 defines a low voltage element region 2 as an example of an electrically-floating element forming region in the present disclosure.

Specifically, the epitaxial substrate 45 includes a p-type silicon substrate 4 and an n$^-$-type epitaxial layer 5 formed on the silicon substrate 4. Further, the p-type element isolation well 7 of a band shape which forms a closed curve when viewed from the top is formed to extend from a surface of the n⁻-type epitaxial layer 5 to the silicon substrate 4. As used herein, the term "curve" may also include a broken line. The thickness of the n⁻-type epitaxial layer 5 is, for example, 5.0 μm to 10 μm.

Although this embodiment describes that the element isolation well 7 is formed in a rectangular annular shape when viewed from the top as shown in FIG. 1, the element isolation well 7 may be any other suitable types of closed curves such as a circular annular shape, a triangular annular shape, and the like. The element isolation well 7 is of a double-layered structure including an upper p⁺-type well region 8 and a lower p⁻-type low isolation (L/I) region 9. A boundary between those regions 8 and 9 is set in a middle portion of the n⁻-type epitaxial layer 5 in a thickness direction of the n⁻-type epitaxial layer 5. For example, the boundary between the regions 8 and 9 may be set at a position of depth of 1.0 μm to 2.0 μm from the surface of the epitaxial layer 5.

As such, the low voltage element region 2 including a portion of the n⁻-type epitaxial layer 5 which is surrounded by the element isolation well 7 on the silicon substrate 4 is defined in the epitaxial substrate 45. An n⁺-type buried layer (B/L) 6 is selectively formed in the low voltage element region 2. The buried layer 6 is formed to straddle a boundary between the silicon substrate 4 and the n⁻-type epitaxial layer 5 in the epitaxial substrate 45. The thickness of the buried layer 6 is, for example, 2.0 μm to 3.0 μm.

In addition, a high voltage element region 3 as an example of an element forming region in the present disclosure electrically floats in the same manner as the low voltage element region 2. The high voltage element region 3 is defined in an outside peripheral region of the low voltage element region 2 in the epitaxial substrate 45. The high voltage element region 3 may be formed to be adjacent to the low voltage element region 2 with the element isolation well 7 interposed therebetween. Alternatively, as shown in FIG. 1, the high voltage element region 3 may be formed in a region spaced apart from the low voltage element region 2 by an element isolation structure (not shown) (for example, a well having the same shape as the element isolation well 7).

In addition, the low voltage element region 2 is a region which is operated based on a low reference voltage and is supplied with a voltage of, for example, about 5V to 100V. The high voltage element region 3 is supplied with a high voltage of, for example, about 400V to 600V. A band-shaped field insulating film 10 forming a closed curve is formed on the surface of the element isolation well 7. Like the element isolation well 7, the field insulating film 10 may be formed in a rectangular annular shape when viewed from the top so as to surround the low voltage element region 2. The field insulating film 10 may be formed to be wider than the element isolation well 7 to cover the element isolation well 7 entirely. For example, the field insulating film 10 may be configured as a LOCOS film formed by selectively oxidizing the surface of the n⁻-epitaxial layer 5.

A conductive film 11 is formed on the field insulating film 10 and faces the element isolation well 7 with the field insulating film 10 interposed between the conductive film 11 and the element isolation well 7. Similar to the element isolation well 7, the conductive film 11 may be formed in a band shape which forms a closed curve. As such, the conductive film 11 may be formed in a rectangular annular shape when viewed from the top so as to surround the low voltage element region 2. The conductive film 11 may include, for example, a conductive material such as poly-silicon, aluminum, or the like, and its thickness may be, for example, 0.4 μm to 1.0 μm. A voltage potential of the conductive film 11 is fixed to be a specified voltage potential via a wiring formed on an interlayer insulating film such as a first interlayer insulating film 21 or a second interlayer insulating film 25 which will be described later. In this embodiment, the voltage potential of the conductive film 11 is fixed to be a ground potential. In this case, the voltage potential of the conductive film 11 may be fixed to be the ground potential by being connected to a source wiring 29 which will be described later.

A DMOSFET (Double-Diffused MOSFET) 35 is formed in the low voltage element region 2. The DMOSFET 35 includes an n⁻-type well region 13 and a p⁻-type well region 15 which are formed to be spaced apart from each other on the surface of the n⁻-type epitaxial layer 5. The n⁻-type well region 13 is formed along the field insulating film 10, when viewed from the top, to surround the p⁻-type well region 15.

An n⁺-type drain region 14 having an impurity concentration higher than that of the well region 13 is formed on the surface of the n⁻-type well region 13. In addition, an n⁺-type source region 17 is formed on the surface of the p⁻-type well region 15 to surround a p⁺-type impurity region 16 which has an impurity concentration higher than that of the p⁻-type well region 15. The outer periphery of the n⁺-type source region 17 is arranged at a position spaced inward from the outer periphery of the p⁻-type well region 15 by a specified distance. For example, the n⁺-type source region 17 may be formed with the same concentration and depth as the n⁺-type drain region 14. In addition, the p⁺-type impurity region 16 is formed with the same depth as the n⁺-type source region 17.

An annular field insulating film 12 is formed on the surface of the n⁻-type epitaxial layer 5 in a region between the n⁻-type well region 13 and the p⁻-type well region 15. The field insulating film 12 may be formed as a LOCOS film of a rectangular annular shape when viewed from the top in the same process as the above-described field insulating film 10. The outer periphery of the field insulating film 12 is arranged on the periphery of the n⁺-type drain region 14, and the inner periphery of the field insulating film 12 is arranged at a position spaced outward from the outer periphery of the p⁻-type well region 15 by a specified distance. The n⁺-type drain region 14 is formed in a region surrounded by the field insulating film 10 and the outer periphery of the field insulating film 12.

A gate insulating film 18 is formed on the surface of the n⁻-type epitaxial layer 5 to straddle a boundary between the n⁻-type epitaxial layer 5 and the p⁻-type well region 15. A gate electrode 19 is formed with the gate insulating film 18 interposed. The gate electrode 19 is formed to selectively cover a portion of the gate insulating film 18 and a portion of the field insulating film 12. For example, the gate electrode 19 may be formed with the same material and thickness as the conductive film 11. For example, the gate insulating film 18 may be a silicon oxide film formed by oxidizing the surface of the n⁻-type epitaxial layer 5.

A region in which the gate electrode 19 faces the p⁻-type well region 15 via the gate insulating film 18 corresponds to a channel region 20 of the DMOSFET 35. Forming a channel in the channel region 20 is controlled by the gate electrode 19. First to fourth interlayer insulating films 21, 25, 27, and 36 are formed to cover the low voltage element region 2 entirely. The first to fourth interlayer insulating films 21, 25, 27, and 36 are configured as insulating films such as oxide films or nitride films. Although this embodiment only illustrates the first to fourth interlayer insulating films 21, 25, 27, and 36, fifth, sixth, or subsequent interlayer insulating films may be formed on the fourth interlayer insulating film 36.

Low voltage contacts 23 and 24 are formed on the first interlayer insulating film 21. The low voltage contacts 23 and 24 include a drain contact 23 and a source contact 24 formed to penetrate through the first interlayer insulating film 21. In the following descriptions, the drain contact 23 and the source contact 24 may be collectively referred to as the low voltage contacts 23 and 24. The drain contact 23 is electrically connected to the n$^+$-type drain region 14, and the source contact 24 is electrically connected to the p$^+$-type impurity region 16 and the n$^+$-type source region 17. The low voltage contacts may include a gate contact (not shown) electrically connected to the gate electrode 19.

The second interlayer insulating film 25 and the third interlayer insulating film 27 are formed in that order on the first interlayer insulating film 21 to cover the low voltage contacts 23 and 24. Low voltage wirings 28 and 29 as an example of wirings in the present disclosure are selectively formed on the third interlayer insulating film 27 and are electrically connected to the low voltage contacts 23 and 24. As shown in FIG. 1, the low voltage wirings 28 and 29 include a drain wiring 28 and a source wiring 29. In the following descriptions, the drain wiring 28 and the source wiring 29 may be collectively referred to as the low voltage wirings 28 and 29. The drain wiring 28 is electrically connected to the n$^+$-type drain region 14 via the drain contact 23, and the source wiring 29 is electrically connected to the n$^+$-type source region 17 via the source contact 24. The low voltage wirings may include a gate wiring (not shown) electrically connected to the gate electrode 19.

In this embodiment, the drain wiring 28 and the source wiring 29 cross the element isolation well 7 in a width direction from the outside peripheral region to be drawn around onto the drain contact 23 and the source contact 24, and connected to the contacts 23 and 24, respectively. A voltage potential of the source wiring 29 may be fixed to a specified voltage potential, for example, a ground potential. For example, the source wiring 29 may be connected to the conductive film 11. In addition, for example, a voltage of about 5V to 100V may be applied to the drain wiring 28, and a voltage of about 0V to 30V may be applied to the gate wiring (not shown). As such, relatively low voltages are applied to the low voltage wirings. The fourth interlayer insulating film 36 is formed on the third interlayer insulating film 27 to cover the low voltage wirings 28 and 29 which are formed on the third interlayer insulating film 27.

As an example of a wiring in the present disclosure, a high voltage wiring 30 is formed on the fourth interlayer insulating film 36. A voltage (for example, 400V to 600V) which is relatively higher than that of the low voltage wirings 28 and 29 is applied to the high voltage wiring 30. In this embodiment, the high voltage wiring 30 is formed in a straight line to cross the element isolation well 7 in a width direction as the low voltage element region 2 is divided into two parts. The high voltage wiring 30 is connected to individual parts of the high voltage element region 3 (e.g., a drain contact (not shown) in the high voltage element region 3).

Figure 3A:
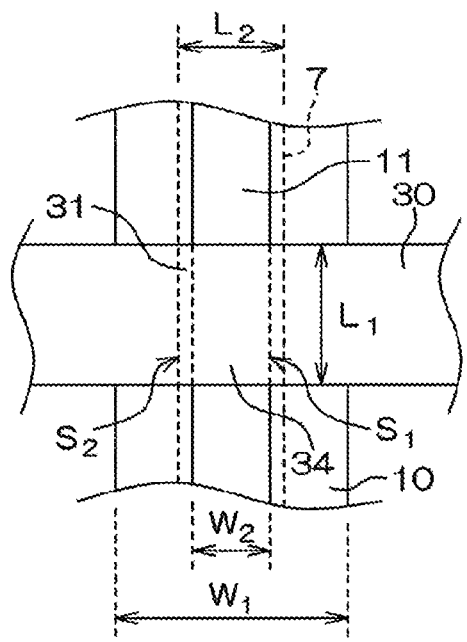
FIG. 3A illustrates an enlarged plan view for an example of a layout of a conductive film shown in FIG. 1.
Figure 3B:
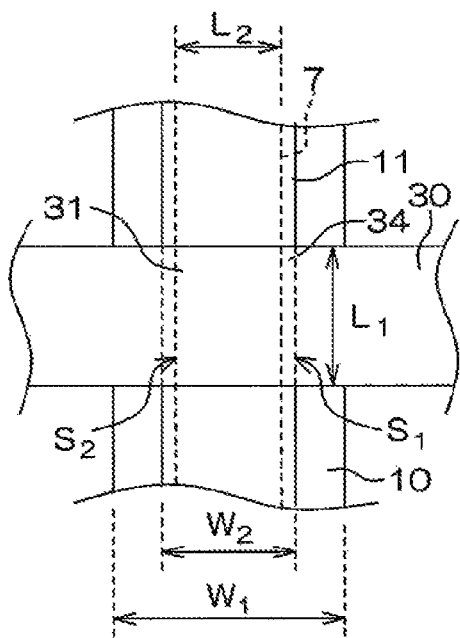
FIG. 3B illustrates an enlarged plan view for another example of a layout of a conductive film shown in FIG. 1.
Figure 3C:
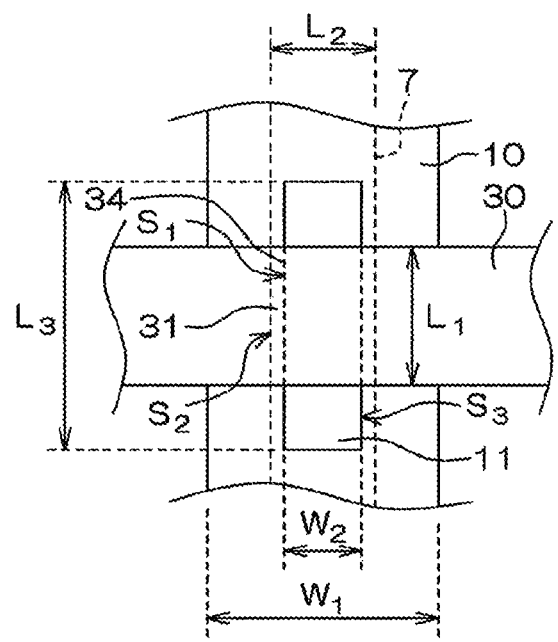
FIG. 3C illustrates an enlarged plan view for still another example of a layout of a conductive film shown in FIG. 1.

Layouts of the conductive film 11 are described below in more detail with reference to FIGS. 3A to 3C. FIGS. 3A to 3C illustrate enlarged plan views for examples of the layout of the conductive film 11 of FIG. 1. As illustrated in the layout of FIG. 3A, the conductive film 11 is interposed between the field insulating film 10 and an intersection portion 31 in which the element isolation well 7 and the high voltage wiring 30 intersect. In this case, the width $W_1$ of the field insulating film 10 may be, for example, 5.0 μm to 10 μm. The width $W_2$ of the conductive film 11 may be, for example, 2.0 μm to 3.0 μm, which is smaller than the width $W_1$ of the field insulating film 10.

In a direction in which the element isolation well 7 intersects the high voltage wiring 30 at the intersection portion 31 (i.e., an extending direction of the element isolation well 7), the length of the conductive film 11 is longer than the length $L_1$ of the intersection portion 31. On the other hand, in a direction in which the high voltage wiring 30 intersects the element isolation well 7 at the intersection portion 31 (i.e., an extending direction of the high voltage wiring 30), the length of the conductive film 11 (i.e., the width $W_2$ of the conductive film 11) is shorter than the length $L_2$ of the intersection portion 31 (i.e., $W_2 < L_2$). As such, the conductive film 11 is formed such that an area $S_1$ (i.e., $W_2 \times L_1$ in this embodiment) of an intersection portion 34 in which the conductive film 11 and the high voltage wiring 30 intersect is smaller than an area $S_2$ (i.e., $L_1 \times L_2$ in this embodiment) of the intersection portion 31 in which the element isolation well 7 and the high voltage wiring 30 intersect (i.e., $S_1 < S_2$).

Next, as illustrated in the layout of FIG. 3B, unlike the case of FIG. 3A, the width $W_2$ of the conductive film 11 may be equal to or larger than the length $L_2$ of the intersection portion 31 (i.e., $W_2 \geq L_2$) in an inner region of the field insulating film 10 in the extending direction of the high voltage wiring 30. In this case, the width $W_2$ of the conductive film 11 may be substantially equal to the width $W_1$ of the field insulating film 10.

In addition, the conductive film 11 may be formed such that the area $S_1$ (i.e., $W_2 \times L_1$ in this embodiment) of the intersection portion 34 in which the conductive film 11 and the high voltage wiring 30 intersect is equal to or larger than the area $S_2$ (i.e., $L_1 \times L_2$ in this embodiment) of the intersection portion 31 in which the element isolation well 7 and the high voltage wiring 30 intersect (i.e., $S_1 \geq S_2$). This may allow the conductive film 11 to reliably and entirely cover, via the field insulating film 10, a region where the element isolation well 7 is formed.

Next, the conductive film 11 illustrated in the layout of FIG. 3C is different from those illustrated in FIGS. 3A and 3B in that the conductive film 11 in FIG. 3C is formed in and around a region where the high voltage wiring 30 and the element isolation well 7 intersect, instead of being formed in a band shape that forms a closed curve. In this case, the conductive film 11 may be formed such that the length $L_3$ of the conductive film 11 is equal to or larger than the length $L_1$ of the intersection portion 31 (i.e., $L_3 \geq L_1$) in the extending direction of the element isolation well 7. Although FIG. 3C illustrates that the width $W_2$ of the conductive film 11 is equal to or smaller than the length $L_2$ of the intersection portion 31 in the extending direction of the high voltage wiring 30 (i.e., $W_2 \leq L_2$), the width $W_2$ may be equal to or larger than the length $L_2$ of the intersection portion 31 (i.e., $W_2 \geq L_2$), similar to the case of FIG. 3B.

As such, an area $S_3$ (i.e., $W_2 \times L_3$ in this embodiment) of a region, in which the conductive film 11 is formed, may be larger than the area S (i.e., $W_2 \times L_1$ in this embodiment) of the intersection portion 34 of the conductive film 11 and the high voltage wiring 30, as illustrated in FIG. 3C. This may allow the conductive film 11 to reliably cover the element isolation well 7 which is disposed not only directly below the high voltage wiring 30 but also to be apart from the high voltage wiring 30. The area $S_3$ (i.e., $W_2 \times L_3$ in this embodiment) of the region where the conductive film 11 is formed may be equal to the area S (i.e., $W_1 \times L_1$ in this embodiment) of the intersection portion 34 (i.e., $S_1 = S_3$) or may be equal to the area $S_2$ (i.e., $L_1 \times L_2$ in this embodiment) of the intersection portion 31 (i.e., $S_2 = S_3$).

Although FIGS. 3A to 3C illustrate the above examples for the layout of the conductive film 11 and the high voltage wiring 30, the layout is not limited to the high voltage wiring 30 but may be applied to, for example, the low voltage wirings 28 and 29. Thus, in the semiconductor device 1, the high voltage wiring 30 and the low voltage wirings 28 and 29 intersect the element isolation well 7. Therefore, a distance between the element isolation well 7 and each of the wirings 28, 29, and 30 decreases as compared to a case where each of the wirings 28, 29, and 30 and the element isolation well 7 do not intersect. In addition, since the high voltage wiring 30 is provided with a voltage higher than those provided to the low voltage wirings 28 and 29, the high voltage wiring 30 generates an electric field relatively higher than those the low voltage wirings 28 and 29 generate. Therefore, in such a structure, it is highly likely to cause a field inversion in the region directly below the field insulating film 10, that is, in the element isolation well 7.

However, with the configurations of the semiconductor device 1, an effect by the electric field from the low voltage wirings 28 and 29 and the high voltage wiring 30 can be reduced by the conductive film 11. Specifically, since the conductive film 11 fixed at the ground potential is positioned to be closer to the low voltage wirings 28 and 29 and the high voltage wiring 30 than the element isolation well 7, the electric field from both of the high voltage wiring 30 and the low voltage wiring 28 and 29 can be effectively terminated by the conductive film 11.

Thus, it is possible to prevent a field inversion which may be caused when the electric field from both of the low voltage wirings 28 and 29 and the high voltage wiring 30 attracts ions in the element isolation well 7 to the region directly below the field insulating film 10. As a result, it is possible to prevent a leakage current which may flow through a leak path formed across the element isolation well 7, thereby providing a semiconductor device with the more stable element isolation.

In addition, when the conductive film 11 is formed in a band shape that forms a closed curve (as illustrated in FIGS. 3A and 3B), the conductive film 11 is disposed directly above the element isolation well 7 in a region on the field insulating film 10. Therefore, although the element isolation well 7 intersects the low voltage wirings 28 and 29 and the high voltage wiring 30, the electric field generated by the low voltage wirings 28 and 29 and the high voltage wiring 30 can be properly terminated by the conductive film 11.

As a result, it is possible to prevent the field inversion from being caused in the element isolation well 7 regardless of the wiring rules of the low voltage wirings 28 and 29 and the high voltage wiring 30, thereby further increasing a degree of freedom of a design rule for forming the wirings. Further, it is possible to efficiently use a semiconductor chip area and hence achieve a reduction in size of the semiconductor chip.

A method of manufacturing the semiconductor device 1 is described below with reference to FIGS. 4A to 4H.

Figure 4A:
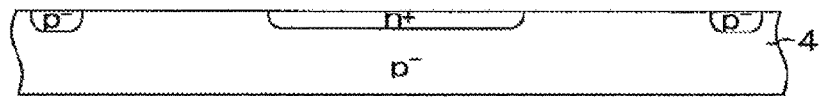
FIG. 4A illustrates a sectional view for an example of a process for manufacturing the semiconductor device of FIG. 1.
Figure 4B:
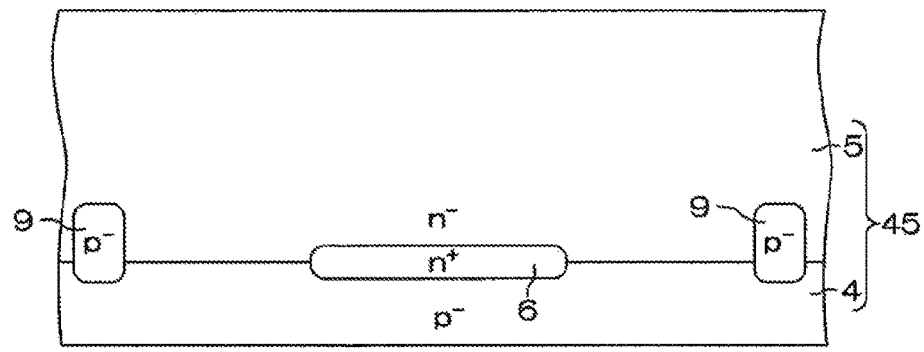
FIG. 4B illustrates a manufacturing process subsequent to FIG. 4A.

FIGS. 4A to 4H illustrate sectional views of an example of the method for manufacturing the semiconductor device 1. FIGS. 4A to 4H correspond to FIG. 2. To manufacture the semiconductor device 1, the p⁻-type silicon substrate 4 is provided as illustrated in FIG. 4A. Next, n-type impurities and p-type impurities are selectively implanted into a surface of the silicon substrate 4. Then, under a temperature of, for example, 1,100 degrees C. or higher, silicon in the silicon substrate 4 is epitaxially grown while adding n-type impurities. Thus, as illustrated in FIG. 4B, the epitaxial substrate 45 including the silicon substrate 4 and the n⁻-type epitaxial layer 5 is formed.

Once the silicon substrate 4 is epitaxially grown, the n-type impurities and the p-type impurities implanted into the silicon substrate 4 are diffused in a growth direction of the n⁻-type epitaxial layer 5. Thus, the buried layer 6 and the p⁻-type low isolation region 9 are formed to straddle the boundary between the silicon substrate 4 and the n⁻-type epitaxial layer 5. Examples of the p-type impurities may include B (boron), Al (aluminum), and the like, and examples of the n-type impurities may include P (phosphorus), As (arsenic), and the like.

Figure 4C:
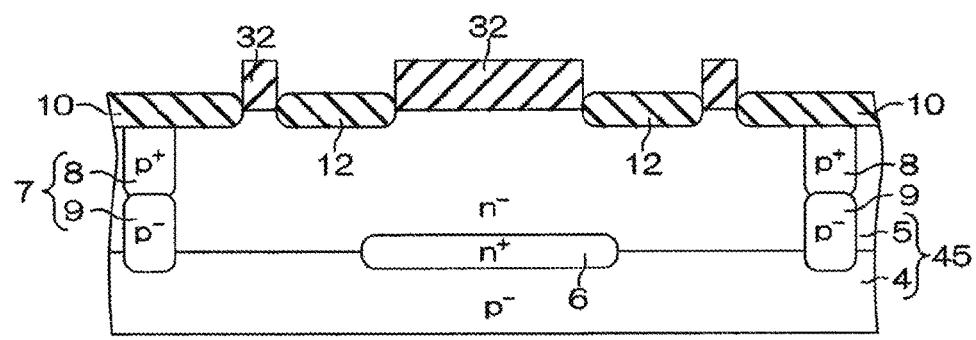
FIG. 4C illustrates a manufacturing process subsequent to FIG. 4B.

Next, an ion implantation mask (not shown), which has openings selectively formed in a region where the p⁺-type well region 8 is to be formed as illustrated in FIG. 4C, is formed on the n⁻-type epitaxial layer 5. P-type impurities are then implanted into the n⁻-type epitaxial layer 5 through the ion implantation mask. Thus, the element isolation well 7 having a double-layered structure including the p⁺-type well region 8 and the p⁻-type low isolation region 9 is formed. The ion implantation mask is removed after forming the element isolation well 7.

Next, a hard mask 32, which has openings selectively formed in a region where the field insulating films 10 and 12 are to be formed, is formed on the n⁻-type epitaxial layer 5. The field insulating films 10 and 12 configured as LOCOS films are then formed by subjecting the surface of the n⁻-type epitaxial layer 5 to a thermal oxidation process through the hard mask 32. The hard mask 32 is removed after forming the field insulating films 10 and 12.

Figure 4D:
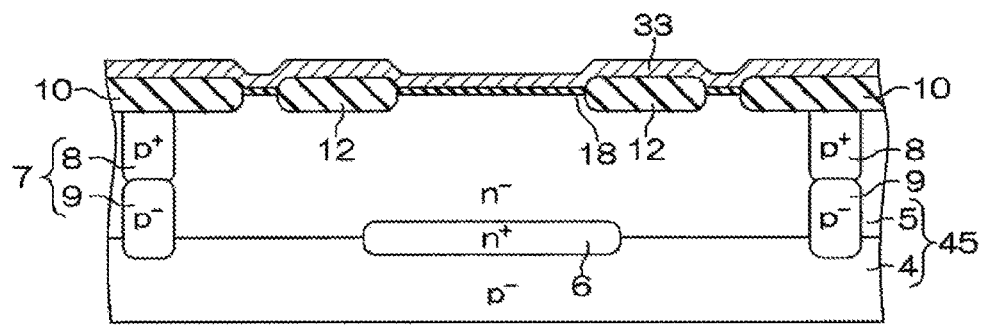
FIG. 4D illustrates a manufacturing process subsequent to FIG. 4C.

As illustrated in FIG. 4D, the gate insulating film 18 is formed by subjecting the surface of the n⁻-type epitaxial layer 5 to thermal oxidation process. In this case, the gate insulating film 18 is formed to be connected with the field insulating films 10 and 12. A polysilicon layer 33 is then formed, on the n⁻-type epitaxial layer 5, by depositing polysilicon for the conductive film 11 and the gate electrode 19.

Figure 4E:
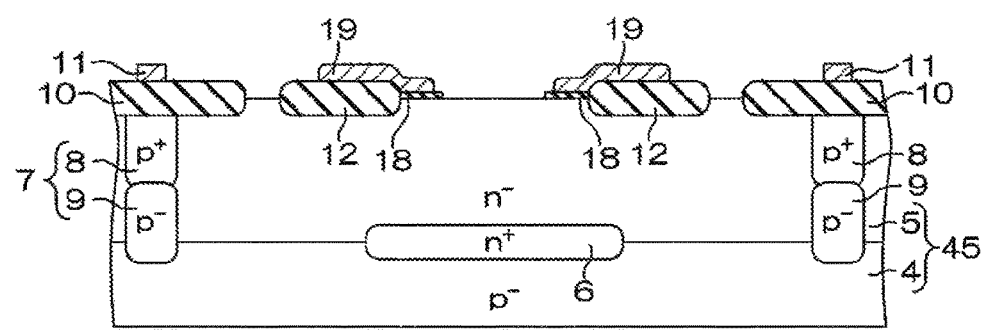
FIG. 4E illustrates a manufacturing process subsequent to FIG. 4D.

A resist mask (not shown), which has openings selectively formed in a region where the conductive film 11 and the gate electrode 19 are to be formed as illustrated in FIG. 4E, is formed on the polysilicon layer 33. Unnecessary portions of the polysilicon layer 33 are then removed by etching through the resist mask. Thus, the conductive film 11 and the gate electrode 19 are simultaneously formed. Further, in this case, the layouts of the conductive film 11 shown in FIGS. 3A to 3C can be obtained by changing a layout of the resist mask. The resist mask is removed after forming the conductive film 11 and the gate electrode 19.

Next, to remove unnecessary portions of the gate insulating film 18, a hard mask (not shown), which has openings in selective regions, is formed on the n⁻-type epitaxial layer 5. Then, the unnecessary portions of the gate insulating film 18 are removed by performing etching through the hard mask. Thus, the gate insulating film 18 is formed. The hard mask is removed after forming the gate insulating film 18.

Figure 4F:
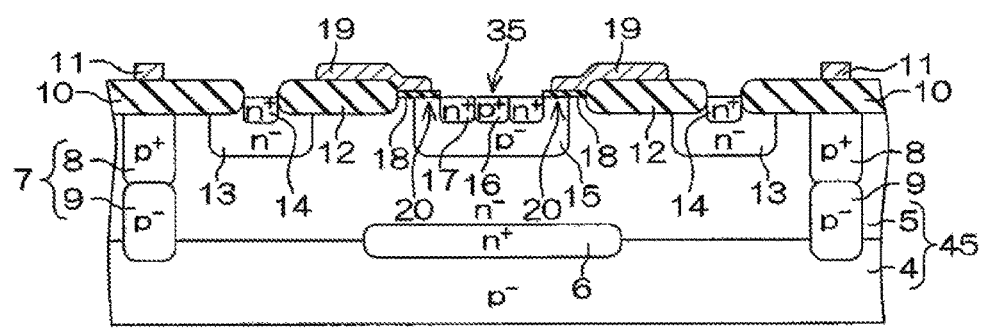
FIG. 4F illustrates a manufacturing process subsequent to FIG. 4E.

As illustrated in FIG. 4F, the n⁻-type well region 13 and the p⁻-type well region 15 are then formed. To form the n⁻-type well region 13, an ion implantation mask (not shown), which has an opening selectively formed in a region where the n⁻-type well region 13 is to be formed, is formed. Then, n-type impurities are implanted into the n⁻-type epitaxial layer 5 through the ion implantation mask. Thus, the n⁻-type well region 13 is formed. The ion implantation mask is removed after forming the n⁻-type well region 13. Additionally, in a similar manner, p-type impurities are implanted into the n⁻-type epitaxial layer 5 through an ion implantation mask. Thus, the p⁻-type well region 15 is formed. The ion implantation mask is removed after forming the p⁻-type well region 15.

Next, the p⁺-type impurity region 16 is formed in an inner region of the p⁻-type well region 15. To form the p⁺-type impurity region 16, an ion implantation mask (not shown), which has an opening selectively formed in a region where the p+ type impurity region 16 is to be formed, is formed. P-type impurities are then implanted into the p⁻-type well region 15 through the ion implantation mask. Thus, the p⁺-type impurity region 16 is formed in the inner region of the p⁻-type well region 15. The ion implantation mask is removed after forming the p⁺-type impurity region 16.

Next, the n⁺-type drain region 14 and the n⁺-type source region 17 are formed in the inner regions of the n⁻-type well region 13 and the p⁻-type well region 15, respectively. To form the n⁺-type drain region 14 and the n⁺-type source region 17, an ion implantation mask (not shown), which has openings in regions where the n⁺-type drain region 14 and the n⁺-type source region 17 are to be formed, is formed. N-type impurities are then implanted into the n⁻-type well region 13 and the p⁻-type well region 15 through the ion implantation mask. Thus, the n⁺-type drain region 14 and the n⁺-type source region 17 are formed. The ion implantation mask is removed after forming the n⁺-type drain region 14 and the n⁺-type source region 17.

Figure 4G:
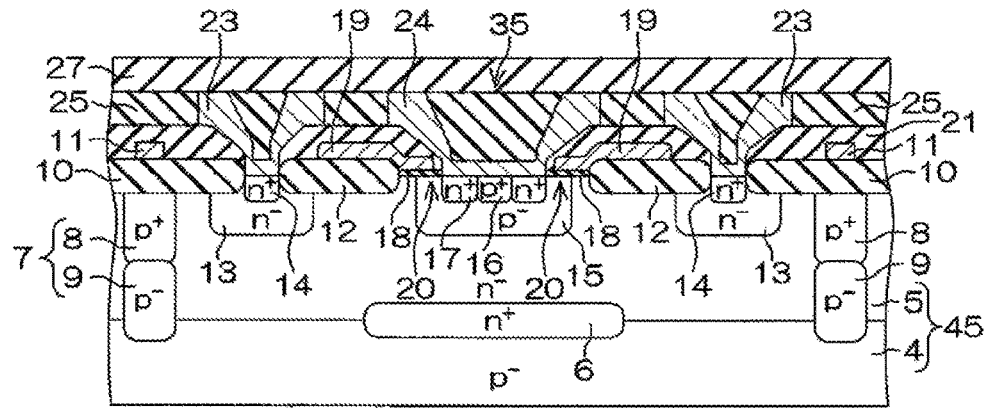
FIG. 4G illustrates a manufacturing process subsequent to FIG. 4F.

As illustrated in FIG. 4G, the first interlayer insulating film 21 is formed by depositing an insulating material to cover the conductive film 11 and the gate electrode 19. Next, low voltage contacts including the drain contact 23 and the source contact 24 are formed to penetrate through the first interlayer insulating film 21 and to be electrically connected to the n⁺-type drain region 14 and the n⁺-type source region 17, respectively. The second interlayer insulating film 25 and the third interlayer insulating film 27 are then formed in that order on the first interlayer insulating film 21 to cover the drain contact 23 and the source contact 24.

Figure 4H:
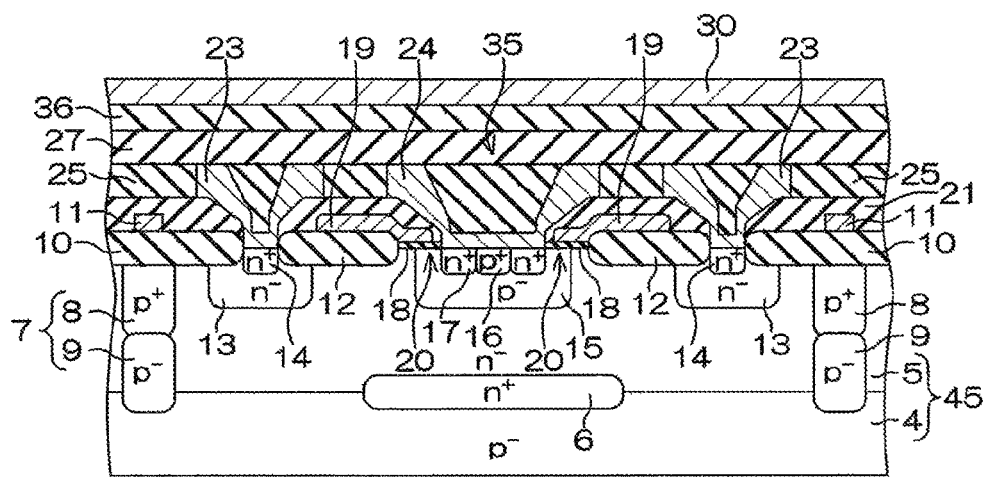
FIG. 4H illustrates a manufacturing process subsequent to FIG. 4G.

As illustrated in FIG. 4H, the drain wiring 28 and the source wiring 29 as low voltage wirings (as also shown in FIG. 1), which are electrically connected, to the drain contact 23 and the source contact 24, respectively, are selectively formed on the third interlayer insulating film 27. To form the low voltage wirings 28 and 29, a resist mask, which has specified openings in regions where the low voltage wirings 28 and 29 are to be formed, is formed. The low voltage wirings 28 and 29 are then formed by depositing an electrode material through the resist mask.

Next, the fourth interlayer insulating film 36 is formed on the third interlayer insulating film 27 to cover the low voltage wirings 28 and 29. The high voltage wiring 30 electrically connected to the high voltage element region 3 is then formed on the fourth interlayer insulating film 36. The semiconductor device 1 according to the first embodiment is manufactured through the above-described processes. As described above, according to the method of manufacturing the semiconductor device 1, the conductive film 11 and the gate electrode 19 of the DMOSFET 35 can be formed in the same process. Thus, it is possible to form the conductive film 11 and the gate electrode 19 of the DMOSFET 35 by changing the layout of the resist mask (as described with reference to FIG. 4E) in the manufacturing process of the semiconductor device 1. Therefore, there is no need to add a new manufacturing process, which can result in a decrease in number of manufacturing processes.

In addition, in the manufacturing process of FIG. 4E, by setting the length of the conductive film 11 to be equal to or larger than the length L1 of the intersection portion 31 in the extending direction of the element isolation well 7 (as described with reference to FIGS. 3A to 3C), it is possible for the conductive film 11 to reliably intersect the low voltage wirings 28 and 29 and the high voltage wiring 30 although a positional difference (e.g., misalignment) of the low voltage wirings 28 and 29 and the high voltage wiring 30 occurs in the extending direction of the element isolation well 7. As a result, it is possible to manufacture the semiconductor device 1 that is capable of effectively prevent a field inversion from being caused in the element isolation well 7 directly below the field insulating film 10 in the intersection portion 31.

Figure 5:
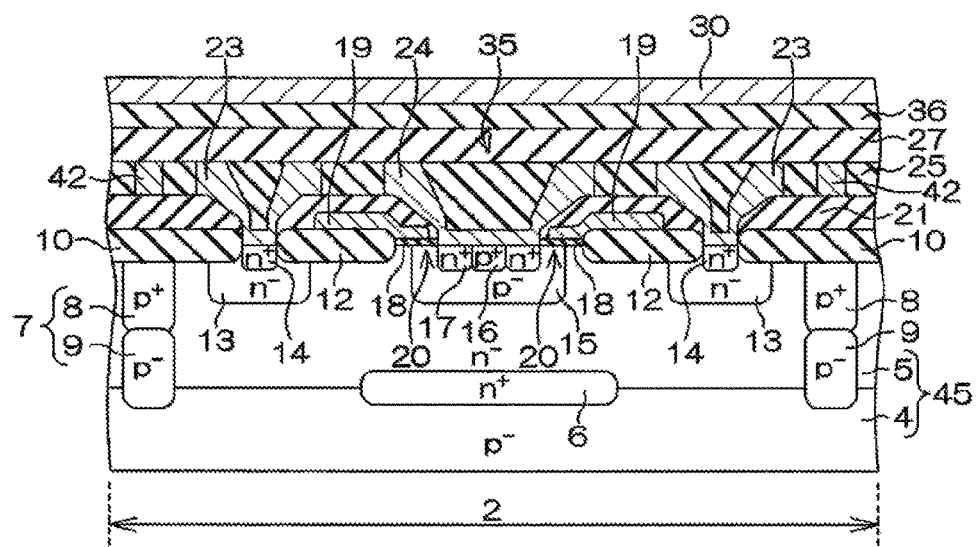
FIG. 5 schematically illustrates a plan view of a semiconductor device according to a second embodiment of the present disclosure.

A semiconductor device 41 according to a second embodiment of the present disclosure will be described below with reference to FIG. 5. FIG. 5 schematically illustrates a sectional view of the semiconductor device 41 according to the second embodiment of the present disclosure. The semiconductor device 41 according to the second embodiment is different from the semiconductor device 1 according to the first embodiment in that a conductive film 42 is formed on the first interlayer insulating film 21. As such, a conductive film for preventing a field inversion need not be formed to contact the surface of the field insulating film 10 but may be formed on an interlayer insulating film on the field insulating film 10. Other configurations are the same as those of the semiconductor device 1 according to the first embodiment. In FIG. 5, the same elements as FIG. 2 are denoted as the same reference numerals and explanations thereof are omitted.

In the second embodiment, the conductive film 42 is formed in the same layer as the drain contact 23 and the source contact 24, i.e., on the first interlayer insulating film 21. In this case, the conductive film 42 faces the element isolation well 7 via the first interlayer insulating film 21 and the field insulating film 10. The conductive film 42 may have a layout similar to the layouts described in FIGS. 3A to 3C illustrating the first embodiment.

The conductive film 42 may be formed with, for example, the same material and thickness as the drain contact 23 and the source contact 24. The conductive film 42 may be made of, for example, aluminum, copper, tungsten, or the like, and its thickness may be, for example, 0.4 μm to 2.0 μm. The voltage potential of the conductive film 42 may be fixed to be the same potential (for example, a ground potential) as the source wiring 29. In this case, the conductive film 42 may be formed to be integrally connected with the source wiring 29.

As described above, the semiconductor device 41 according to the second embodiment can achieve the same effects as those of the semiconductor device 1 according to the first embodiment. In addition, in the semiconductor device 41, the conductive film 42 and the low voltage contacts 23 and 24 can be formed in the same process. Thus, it is possible to form the low voltage contacts 23 and 24 and the conductive film 42 by changing the layout of the resist mask (as described with reference to FIG. 4H) in the manufacturing process of the semiconductor device 41. Therefore, there is no need to add a new manufacturing process, which can result in a decrease in number of manufacturing processes.

Figure 6:
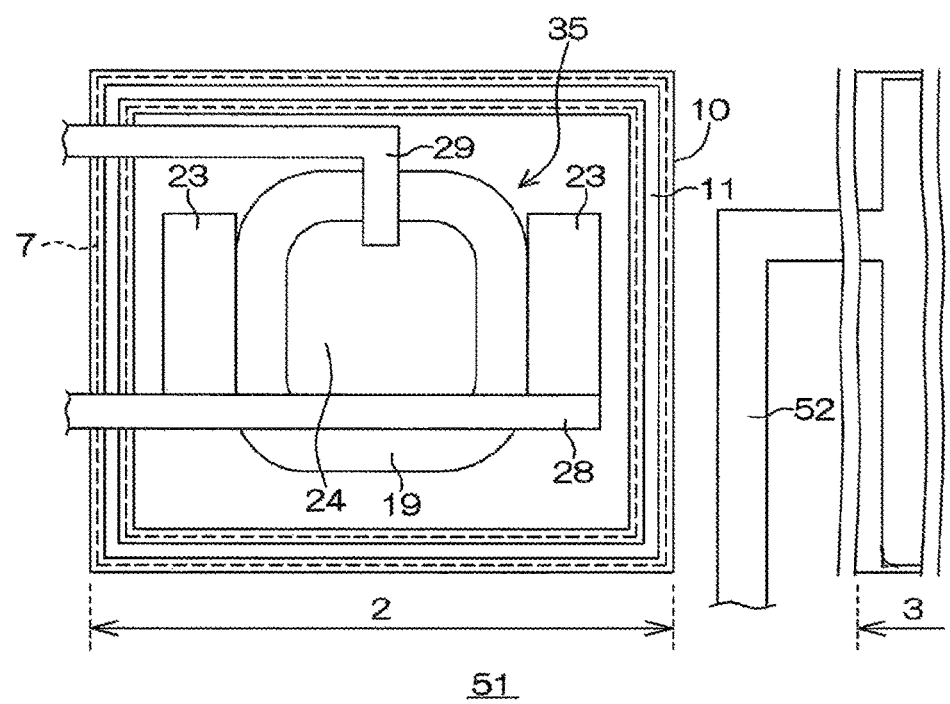
FIG. 6 schematically illustrates a plan view of a semiconductor device according to a third embodiment of the present disclosure.

A semiconductor device 51 according to a third embodiment of the present disclosure will be described with reference to FIG. 6. FIG. 6 schematically illustrates a plan view of the semiconductor device 51 according to the third embodiment of the present disclosure. The semiconductor device 51 according to the third embodiment is different from the semiconductor device 1 according to the first embodiment in that the high voltage wiring 30 is replaced with a high voltage wiring 52. Other configurations are the same as those of the semiconductor device 1. In FIG. 6, the same elements as FIG. 1 are denoted as the same reference numerals and explanations thereof are omitted.

The high voltage wiring 52 is formed to be spaced apart by a specified distance from the low voltage element region 2 along the element isolation well 7. Thus, even with a configuration where the element isolation well 7 does not intersect the high voltage wiring 52, an effect by an electric field from the high voltage wiring 52 can be reduced by the conductive film 11. Although this embodiment illustrates that the conductive film 11 is formed in a rectangular annular shape when viewed from the top as in the first embodiment, the conductive film 11 may be formed along a region where at least the high voltage wiring 52 is formed.

Specifically, as shown in FIG. 6, when the high voltage wiring 52 is spaced apart by the specified distance from the low voltage element region 2, the element isolation well 7 adjacent to the high voltage wiring 52 is likely to be affected by the electric field from the high voltage wiring 52. Therefore, the conductive film 11 may be formed to cover at least a portion of the element isolation well 7 adjacent to the high voltage wiring 52. Thus, it is possible to effectively prevent a field inversion in the element isolation well 7.

Figure 7:
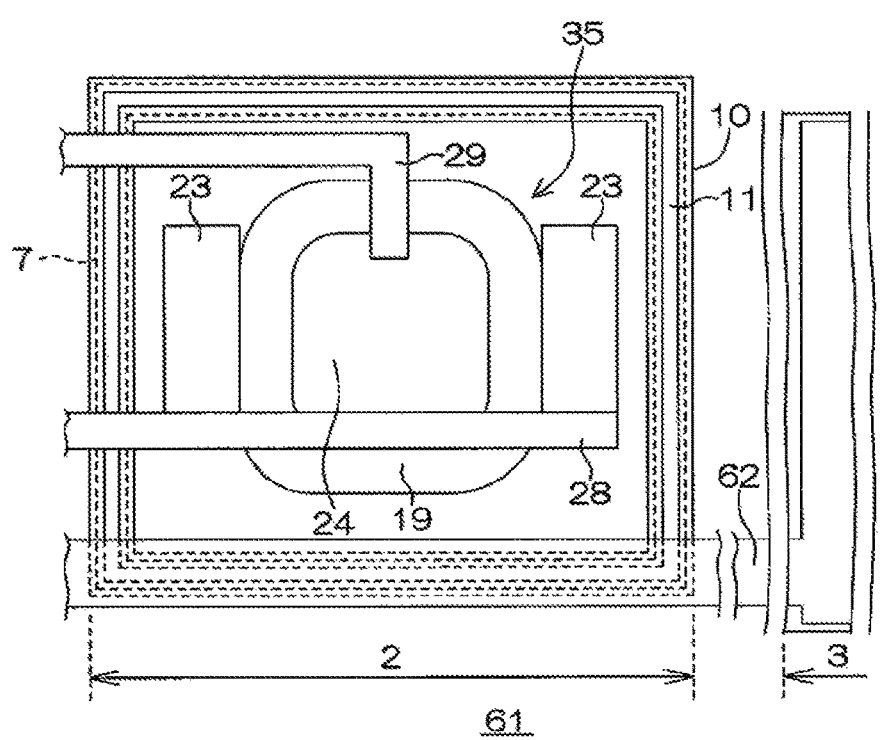
FIG. 7 schematically illustrates a plan view of a semiconductor device according to a fourth embodiment of the present disclosure.

A semiconductor device 61 according to a fourth embodiment of the present disclosure is described below with reference to FIG. 7. FIG. 7 schematically illustrates a plan view of the semiconductor device 61 according to the fourth embodiment of the present disclosure. The semiconductor device 61 according to the fourth embodiment is different from the semiconductor device 1 according to the first embodiment in that the high voltage wiring 30 is replaced with a high voltage wiring 62. Other configurations are the same as those of the semiconductor device 1. In FIG. 7, the same elements as FIG. 1 are denoted as the same reference numerals and explanations thereof are omitted.

The high voltage wiring 62 is formed to completely cover a portion of the field insulating film 10 along a region where the field insulating film 10 is formed. Thus, the high voltage wiring 62 is formed to follow the region where the field insulating film 10 is formed (also, a region where the element isolation well 7 is formed) and cover the field insulating film 10. With this configuration, an effect by an electric field from the high voltage wiring 62 can be reduced by the conductive film 11. Although this embodiment illustrates that the conductive film 11 is formed in a rectangular annular shape when viewed from the top as in the first embodiment, the conductive film 11 may be formed in at least a region where the high voltage wiring 52 faces the element isolation well 7. Therefore, the conductive film 11 may be formed to face the high voltage wiring 62 on the field insulating film 10 directly below the region where the high voltage wiring 62 is formed.

Thus, although the high voltage wiring 62 is formed to completely cover a portion of the field insulating film 10 along the region where the field insulating film 10 is formed, it is possible to reliably prevent a field inversion from being caused in the element isolation well 7. Although the embodiments of the present disclosure are illustrated in the above, the present disclosure may be practiced in different manners. For example, although the first embodiment illustrates that the conductive film 11 is formed in a central portion of the field insulating film 10, the conductive film 11 may be formed at a position shifted in the extending direction of the high voltage wiring 30 as long as the conductive film 11 can be formed to cover some or all of the region where the element isolation well 7 is formed to the extent that it can prevent a field inversion in the element isolation well 7.

In addition, although the first to fourth embodiments illustrates that the DMOSFET 35 is formed in the low voltage element region 2, the present disclosure is not limited thereto. For example, the DMOSFET 35 may be replaced with a CMOS (Complementary MOS), a BJT (Bipolar Junction Transistor), an IGBT (Insulated Gate Bipolar Transistor), a JFET (Junction Field Effect Transistor), a nonvolatile memory having a control gate and a floating gate, and the like.

Further, various circuit elements such as capacitors, resistors and the like may be formed in the low voltage element region 2. Also, combinations of these semiconductor elements and circuit elements may constitute an integrated circuit such as a LSI (Large Scale Integration), SSI (Small Scale Integration), MSI (Medium Scale Integration), VLSI (Very Large Scale Integration), ULSI (Ultra-Very Large Scale Integration), or the like.

Furthermore, although the first to fourth embodiments illustrate the p-type silicon substrate 4, the p-type silicon substrate 4 may be replaced with an n-type silicon substrate 4 having an inverted conductivity type. In this case, the conductivity types of other impurity regions are inverted.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosures.

What is claimed is:

1. A semiconductor device comprising:
   a semiconductor layer having an element formation region in which a semiconductor element is formed;
   an element isolation well formed in a surface portion of the semiconductor layer to isolate at least a portion of the element formation region;
   a field insulating film formed on a surface of the semiconductor layer, the field insulating film surrounding the element formation region in an annular shape when viewed from a top;
   an interlayer insulating film formed on the semiconductor layer;
   a wiring formed on the interlayer insulating film; and
   a conductive film formed between the interlayer insulating film and the field insulating film to face the element isolation well via the field insulating film, wherein
   the element formation region includes:
      a low voltage element region in which an element operated with a low reference voltage is formed; and
      a high voltage element region being supplied with a high reference voltage higher than the low reference voltage,
   the element isolation well is interposed between the low voltage element region and the high voltage element region, and
   the wiring is electrically connected to the high voltage element region.

2. The semiconductor device of claim 1, wherein the semiconductor element includes a MOS transistor having a gate electrode and formed in the element formation region, and wherein the conductive film is formed with the same material as the gate electrode of the MOS transistor.

3. The semiconductor device of claim 2, wherein the gate electrode and the conductive film are formed of polysilicon.

4. The semiconductor device of claim 2, wherein the conductive film has a same thickness as that of the gate electrode.

5. The semiconductor device of claim 2, wherein the field insulating film is a first field insulating film, and the semiconductor device further comprises an annular second field insulating film formed on the surface of the semiconductor layer to be surrounded by the first field insulating film, wherein the conductive film is formed on the first field insulating film and the gate electrode is formed on the annular second insulating film at the same time.

6. The semiconductor device of claim 1, wherein a width of the conductive film is smaller than a width of the field insulating film.

7. The semiconductor device of claim 6, wherein the width of the field insulating film is 5.0 µm to 10 µm, and the width of the conductive film is 2.0 µm to 3.0 µm.

8. The semiconductor device of claim 1, wherein the element isolation well is formed below the field insulating film.

9. The semiconductor device of claim 1, wherein a voltage potential of the conductive film is set to be a specified voltage potential.

10. The semiconductor device of claim 8, wherein a voltage potential of the conductive film is fixed to be a ground potential.

11. The semiconductor device of claim 1, wherein the wiring intersects the field insulating film when viewed from the top, and wherein the conductive film is interposed at an intersection portion between the field insulating film and the wiring.

12. The semiconductor device of claim 1, wherein the conductive film is in direct contact with the field insulating film.

* * * * *